(12) United States Patent
Tepman

(10) Patent No.: US 6,722,834 B1
(45) Date of Patent: *Apr. 20, 2004

(54) ROBOT BLADE WITH DUAL OFFSET WAFER SUPPORTS

(75) Inventor: Avi Tepman, Cupertino, CA (US)

(73) Assignee: Applied Materials, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 819 days.

(21) Appl. No.: 08/946,920

(22) Filed: Oct. 8, 1997

(51) Int. Cl.⁷ .................................................. B44C 1/22
(52) U.S. Cl. ........................ 414/217; 414/416; 414/935; 414/806
(58) Field of Search ................................. 414/941, 217, 414/222, 225, 416, 749, 751, 752, 939, 935, 800, 804, 807, 811, 222.09, 222.12, 749.5, 752.1; 118/719; 294/64.1, 65, 1.1, 87.1

(56) References Cited

U.S. PATENT DOCUMENTS

| | | | |
|---|---|---|---|
| 1,948,592 A | * | 2/1934 | Nelson .................... 294/78 R |
| 4,775,281 A | | 10/1988 | Prentakis .................... 414/416 |
| 4,923,054 A | * | 5/1990 | Ohtani et al. ............ 414/941 X |
| 5,100,502 A | | 3/1992 | Murdoch et al. ............ 156/643 |
| 5,147,175 A | | 9/1992 | Tada ......................... 414/749 |
| 5,227,708 A | | 7/1993 | Lowrance |
| 5,364,222 A | * | 11/1994 | Akimoto et al. ......... 414/941 X |
| 5,404,894 A | * | 4/1995 | Shiraiwa ................. 414/941 X |
| 5,439,547 A | | 8/1995 | Kumagai .................... 156/345 |
| 5,447,409 A | | 9/1995 | Grunes et al. |
| 5,515,986 A | * | 5/1996 | Turlot et al. ............ 414/416 X |
| 5,562,387 A | | 10/1996 | Ishii et al. .................... 414/416 |
| 5,564,889 A | * | 10/1996 | Araki ................ 414/225.01 X |
| 5,613,821 A | * | 3/1997 | Muka et al. ............ 414/416 X |
| 5,626,456 A | * | 5/1997 | Nishi ....................... 414/941 X |
| 5,636,963 A | | 6/1997 | Haraguchi et al. .......... 414/786 |
| 5,647,626 A | | 7/1997 | Chen et al. ................. 294/87.1 |
| 5,647,724 A | | 7/1997 | Davis, Jr. et al. |
| 5,711,646 A | * | 1/1998 | Ueda et al. ............. 414/941 X |
| 5,833,288 A | * | 11/1998 | Itasaka .................... 414/941 X |
| 5,989,346 A | * | 11/1999 | Hiroki .................... 414/938 X |

OTHER PUBLICATIONS

PCT International Search Report Dated Feb. 17, 1999.
U.S. patent application Ser. No. 08/679,868, Kroeker et al., Filed Jul. 15, 1996.
U.S. patent application Ser. No. 09/028,448, Carducci, Filed Feb. 23, 1998.

* cited by examiner

Primary Examiner—Eileen D. Lillis
Assistant Examiner—Charles A Fox
(74) Attorney, Agent, or Firm—Moser, Patterson & Sheridan, LLP

(57) ABSTRACT

A robot blade and a method of using the robot blade for transferring objects, namely substrates, through a process system, the robot blade comprising an upper platform having a first object supporting surface and a lower platform having a second object supporting surface. The robot blade is mounted onto a moveable member, and the assembly facilitates substrate transfers, such as removal of a processed substrate and insertion of an unprocessed substrate within a processing chamber through a single entry of the robot blade into the processing chamber.

24 Claims, 6 Drawing Sheets

ROBOT BLADE WITH DUAL OFFSET WAFER SUPPORTS

BACKGROUND OF THE INVENTION

1. Field of the Invention

The present invention relates to an apparatus for transferring objects in integrated circuit production. More particularly, the present invention relates to a robot blade for transferring substrates through a processing system while reducing the idle time of the process chamber and the number of strokes to effect substrate transfer.

1. Background of the Related Art

The advantages of using robots in the production of integrated circuits to transfer substrates throughout a processing system are well established. Current practice includes the use of robot arms to move substrates from a loading port into various process chambers within a multiple chamber processing system. Various robot arm designs, including frog-leg type and single-arm type, are currently employed in processing chambers. Typically a robot blade having a substrate supporting surface is attached to the end of the robot arm to hold the substrate while it is being transferred. The robot arm can retrieve a substrate from a particular processing chamber or a substrate transferring chamber and shuttle the substrate into another chamber for additional processing. When substrate processing is complete, the robot arm returns the substrate to the loading port and another substrate is moved into the system by the robot for processing. Typically, several substrates are handled in this manner during each process run, and several substrates are passed through the system during a single process cycle.

In multiple chamber process systems, it is desirable to increase the substrate throughput of the system by concurrently processing substrates in each of the chambers. A typical substrate handling sequence used in multiple chamber process systems includes removing a substrate from a process chamber, moving the substrate to the next processing chamber or storing the substrate in a selected location, and then moving a new substrate from a storage location into the processing chamber from which the first substrate was removed. In this sequence of robot movements, the robot arm itself goes through significant repetitive rotations, extensions and retractions to simply exchange substrates within a selected processing chamber.

To increase the efficiency of substrate handling, a robot arm having the ability to handle two substrates at the same time may be provided. For example, FIG. 1 shows one such robot 2 including two sets of carrier arms 4 having robot blades 6 attached which are located at opposed ends of a support which is rotated about a pivot 8. One substrate may be stored on the blade 6 of one arm while the blade 6 on the other arm is used to retrieve and place a second substrate. Once the processed substrate is retrieved from the processing chamber by one arm, the arms are then rotated 180° and the stored substrate may be placed into the processing chamber. Such mechanism does not allow for the immediate replacement of a new substrate in a process chamber after a processed substrate is removed because the robot must rotate 180° to place the substrate on the second arm in a position for loading into the location from which the first substrate was removed.

In an attempt to further increase throughput and decrease chamber idle time associated with substrate transfer, another robot configuration includes coaxially upper and lower robots which can operate independently to remove a first substrate from a processing chamber and to insert a fresh substrate into the same processing chamber. The upper robot operates independently of the lower robot to obtain improved throughput and increased substrate handling capacity of the robot assembly as compared to the opposed, single plane, dual blade robots. The upper robot is typically stacked above the lower robot and the two robots may be mounted concentrically to allow fast substrate transfer. Either robot can be either a single blade robot or dual blade robot.

However, in order to achieve independent operation of the two robots, the assemblies require at least four magnetic or mechanical linkages and the same number of drive motors to maneuver the robot blades within the x-y plane. Compared to a conventional robot assembly, this dual robot configuration is considerably more complex, more expensive to build and maintain, and requires more space, typically above and below the transfer chamber. Moreover, this dual robot configuration still requires full-length strokes of insertion and retraction by each set of the robot arms, requiring the same number of robot movements.

In another attempt to increase throughput and decrease chamber idle time associated with substrate transfer, another robot configuration provides for linked, coordinated movement of simultaneous retraction of one blade and extension of another blade. As compared to a typical processing chamber which is idle during the period of time during which a first substrate is removed from the chamber and during which the robot assembly is rotated to insert a second substrate into the chamber, dual plane robots which can perform a shuttle operation offer a decreased amount of time in which the chamber is not operational. In addition, the time that the slit valve must remain open while the robot transfers a first substrate out of the chamber and inserts a second substrate into the chamber is also decreased. As a result, compared to conventional processing chambers, the throughput of the chamber can be increased and the period of time in which particles present outside the chamber may enter into the chamber can be decreased. However, this configuration still requires individual blades on different planes and multiple sets of robot arms to sequentially transfer a processed substrate out of a processing chamber and a fresh substrate into the processing chamber. Furthermore, this robot configuration still requires full-length strokes of insertion and retraction by each set of the robot arms.

There remains a need for a robot having minimal parts that reduces the amount of idle time that a chamber experiences during removal of a first substrate and insertion of a second substrate by reducing the number of robot movements and simultaneously reducing the amount of time that a slit valve needs to be opened during this sequence, resulting in higher throughput. There is also a need for a robot which minimizes the size of a slit valve opening while capable of transferring substrates on multi planes.

SUMMARY OF THE INVENTION

The present invention provides an apparatus for transferring objects comprising a robot blade attachable to a moveable member, the robot blade having an upper platform having a first object supporting surface and a lower platform having a second object supporting surface. Preferably the upper platform extends further than the lower platform such that the first object supporting surface is horizontally offset from the second object supporting surface. Also, the first object supporting surface and the second object supporting surface preferably occupy parallel planes.

Another aspect of the present invention provides transfer chamber having a robot blade comprising an upper platform having a first object supporting surface and a lower platform having a second object supporting surface, the robot blade attached to a rotatable and retractable robot within a transfer chamber of a processing system.

The present invention further provides a method for transferring objects comprising: providing a robot blade attachable to a moveable member, the robot blade having an upper platform having a first object supporting surface and a lower platform having a second object supporting surface; positioning the first object supporting surface to receive a first object; and positioning the second object supporting surface to deliver a second object. Preferably, the first object supporting surface is laterally offset from the second object supporting surface, and the first object supporting surface and the second object supporting surface preferably occupy parallel planes. The present invention provides a method of substrate transfer through a single insertion of the robot blade which reduces the amount of idle time that a chamber experiences during removal of a first substrate and insertion of a second substrate and simultaneously decreases the amount of time that a slit valve needs to be opened during this sequence by reducing the number of robot movements.

Another aspect of the present invention provides a multi-chamber process system, comprising: a transfer chamber; a plurality of process chambers connected to the transfer chamber; a robot within the transfer chamber; and a robot blade attached to the robot, the robot blade comprising an upper platform having a first object supporting surface and a lower platform having a second object supporting surface.

The present invention further provides a method of transferring objects through various chambers of a multi-chamber process system comprising: providing a transfer chamber connected to one or more process chambers; providing a robot within the transfer chamber; providing a robot blade attached to the robot, the robot blade comprising an upper platform having a first object supporting surface and a lower platform having a second object supporting surface; positioning the blade within a first chamber; retracting the blade out of the first chamber; positioning the blade within the second chamber; and retracting the blade out of the second chamber.

Another aspect of the present invention provides object transfers through a shuttle operation alternatively between the first object supporting surface and the second object supporting surfaces, which can be accomplished through a single insertion of the blade into a chamber. The shuttle operation reduces dead time and increases throughput while reducing the possibility of introducing contamination into the processing chamber.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a robot assembly useful for transferring objects (e.g. substrates) between process chambers with increased throughput of objects. In one aspect of the invention, a single robot blade having dual substrate platforms is provided and attached to a rotatable retractable mechanical linkage to enable removing one substrate from a process chamber and immediately introducing a new substrate into the same chamber, thereby decreasing the chamber idle time associated with substrate transfer which typically requires an 180° rotation of the robot assembly or sequential retractions and extensions of multiple sets of independent robot arms and blades. The mechanical linkage can be any type generally known in the art, including frog-leg type and the single-arm type assemblies, preferably a simplified mechanical linkage requiring minimal moving parts and less cumbersome equipment.

In another aspect of the invention, a method for performing a substrate shuttle operation is provided which utilizes a robot blade having dual substrate platforms which can move through existing slit valve openings. The method reduces chamber idle time by transferring substrates through a single insertion of the robot blade into the chamber and reduces the time required to keep the slit valve open during transfers of substrates by requiring only one insertion to transfer substrates.

Figure 1:
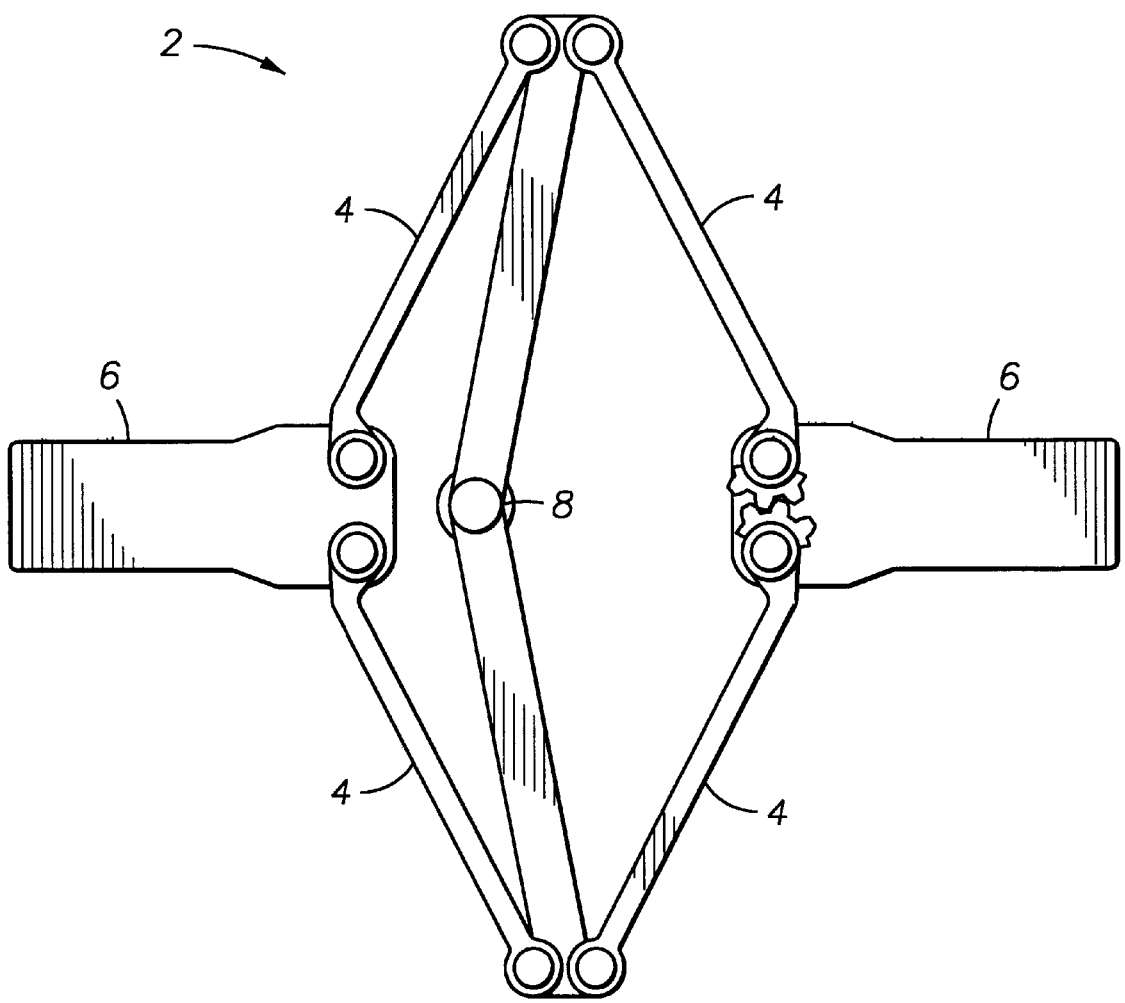
FIG. 1 is a schematic top view of a prior art robot assembly having two sets of carrier arms located on opposed ends.
Figure 2:
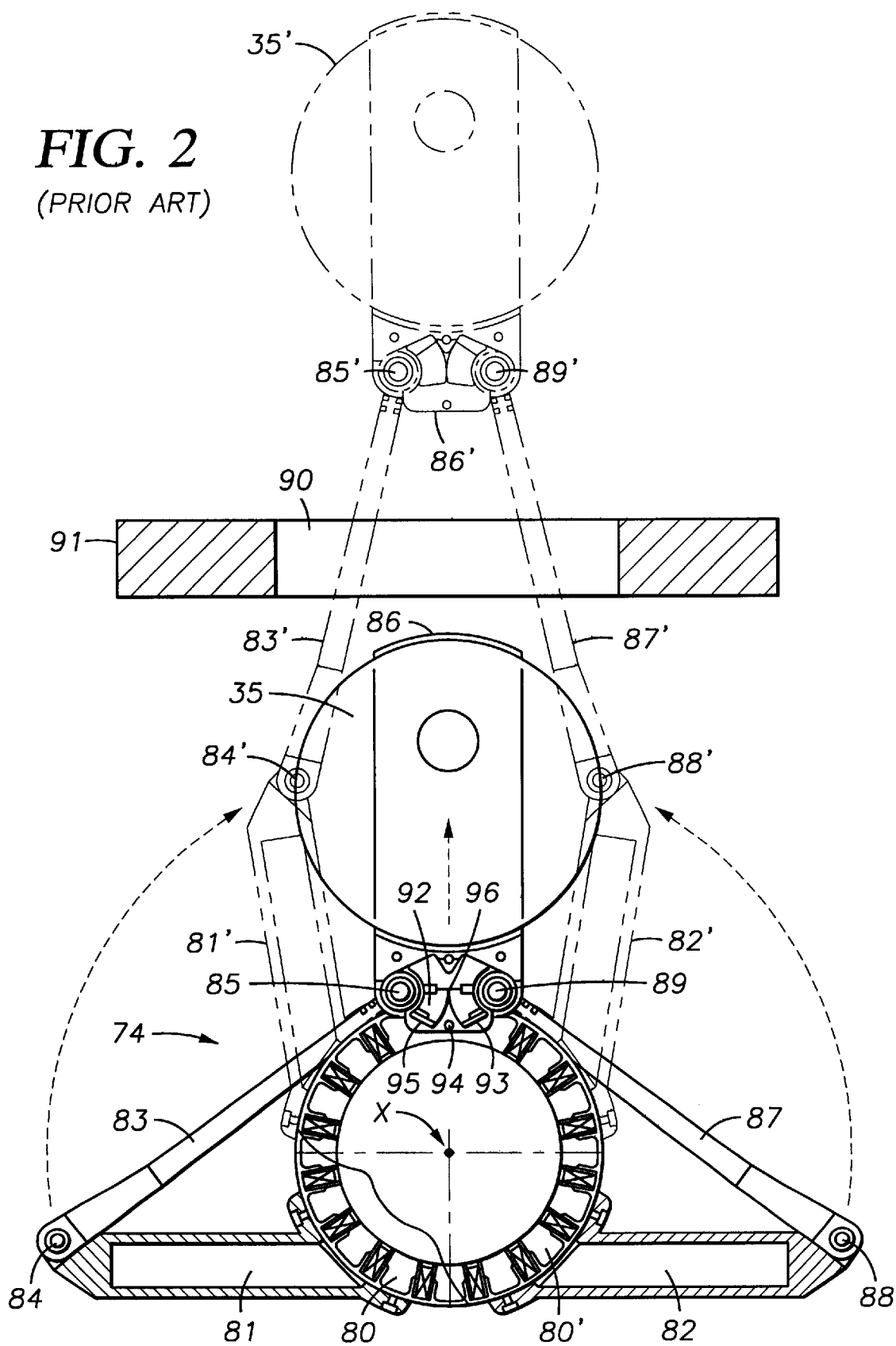
FIG. 2 is a schematic view of a robot arm assembly having a prior art robot blade illustrating a retracted position and an extended position.

FIG. 2 is a schematic view of a robot arm assembly having a prior art robot blade attached, illustrating a retracted position and an extended position of the blade. The "frog-leg" type robot includes two concentric rings 80, 80' magnetically coupled to computer-controlled drive motors for rotating the rings about a common axis. A first strut 81 is fixedly attached to a first magnet ring 80 and a second strut 82 is fixedly attached to a second magnet ring 80'. A third strut 83 is attached by a pivot 84 to strut 81 and by a pivot 85 to a blade 86. A fourth strut 87 is attached by a pivot 88 to strut 82 and by a pivot 89 to blade 86. The structure of struts 81–83, 87 and pivots 84, 85, 88, 89 form a "frog leg" type connection of blade 86 to magnet rings 80, 80'.

When magnet rings 80, 80' rotate in the same direction with the same angular velocity, the robot 14 also rotates about axis x in this same direction with the same velocity. When magnet rings 80, 80' rotate in opposite directions with the same angular velocity, there is no rotation of assembly 14, but instead there is linear radial movement of blade 86 to a position illustrated by dashed elements 81'–89'.

A substrate 35 is shown loaded on blade 86 to illustrate that the blade 86 can be extended through a slit valve 90 in a wall 91 of a processing chamber to transfer such a substrate into or out of the chamber. The robot 74 preferably provides the advantage of being free of particulate generation otherwise caused by rotary motion of a drive rod against a rotary vacuum seal. The mode in which both motors rotate in the same direction at the same speed can be used to rotate the robot from a position suitable for substrate exchange with one chamber to a position suitable for substrate exchange with another chamber. The mode in which both motors rotate with the same speed in opposite directions is then used to extend the blade into one of these chambers and transfer the substrates to or from that chamber. Other combinations of motor rotation can be used to extend or retract the blade as the robot is being rotated about axis x.

To keep blade 86 directed radially away from the rotation axes x, an interlocking mechanism is used between the pivots or cams 85, 89 to assure an equal and opposite angular rotation of each pivot. The interlocking mechanism may take on many designs, including intermeshed gears or straps pulled around the pivots in a figure-8 pattern or the equivalent. One referred interlocking mechanism is a pair of intermeshed gears 92, 93 formed on the pivots 85, 89. These gears are loosely meshed to minimize particulate generation by these gears. To eliminate play between these two gears because of this loose mesh, a weak spring 94 may be extended between a point 95 on one gear to a point 96 on the other gear such that the spring tension lightly rotates these two gears in opposite directions until light contact between these gears is produced.

Even though FIG. 2 shows a prior art single platform robot blade attached to the robot assembly, a robot blade of the present invention can be attached in place of the prior art blade in substantially the same manner at pivots 85 and 89 through typical securing methods such as rivets or nuts and bolts. Thus, a robot blade of the present invention can be easily retrofitted onto existing robot blades currently used in processing systems. The robot is preferably controlled by programmable microprocessors which can vary the robot rotation and the robot arm extensions and retractions to match exactly the positions required for substrate transfers.

Figure 3:
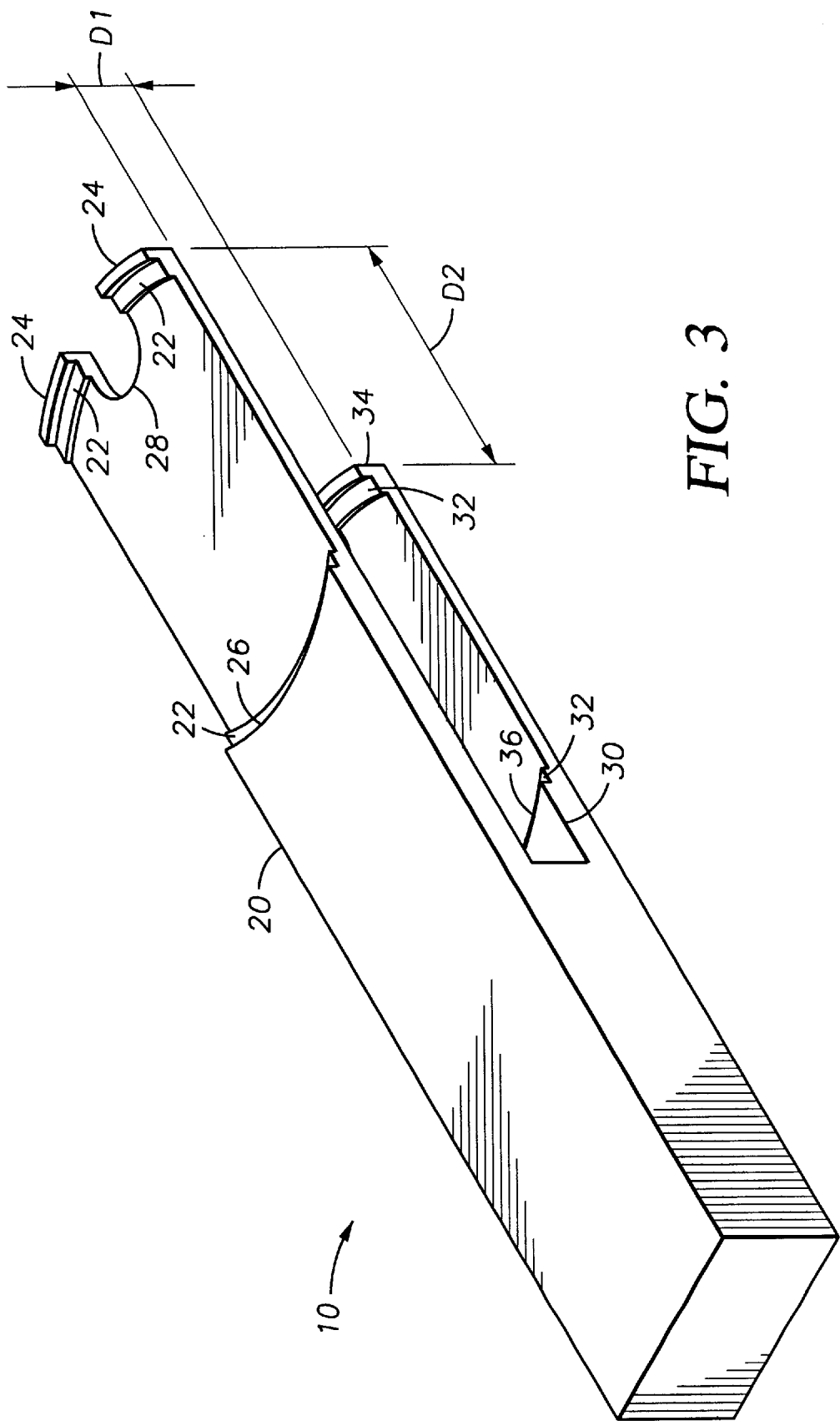
FIG. 3 is a substantially top perspective view of one embodiment of the present invention.

FIG. 3 is a substantially top perspective view of a robot blade with dual offset substrate support surfaces. The blade 10 includes an upper platform 20 having an upper substrate support surface 22 and a lower platform 30 having a lower substrate supporting surface 32. The upper substrate supporting surface and the lower substrate supporting surface preferably occupy parallel planes. Upper platform 20 includes clamping ridges 24 and 26 which partially outline the circumference of a substrate to hold the substrate and prevent substrate movement while the substrate is being transferred on the upper platform 20 from one chamber to another. Preferably, clamping ridges 24 and 26 extend above the upper substrate supporting surface 22 to a height approximately equal to the thickness of a substrate. Similarly, the lower platform 30 includes clamping ridges 34 and 36 which partially outline the circumference of a substrate to hold the substrate and prevent substrate movement while the substrate is being transferred from one chamber to another on the lower platform 30. The upper platform 20 and the lower platform 30 each preferably include a recess 28 at the tip of the platform to allow lift pins disposed in a triangular configuration to access the substrate for either lifting the substrate off the platform or lowering the substrate onto the platform. In a four-lift pin rectangular configuration, the recess 28 may not be necessary where the width of the platform is narrower than the distance between the lift pins such that the platform can travel between the pins.

A vertical clearance distance D1 between the underside of the upper platform 20 and the top of the clamping ridges 34 and 36 is provided to allow free movement of a substrate onto and off of the lower substrate supporting surface 32. Preferably, the vertical clearance distance D1 is minimized as well as the thickness of the upper platform 20 and lower platform 30 so that the overall thickness of the blade 10 is minimized as well. Minimization of the overall thickness of blade 10 results in minimization of the size of slit valve openings in the processing chambers, which in turn reduces the probability of contaminates being introduced into the processing chamber.

Figure 4:
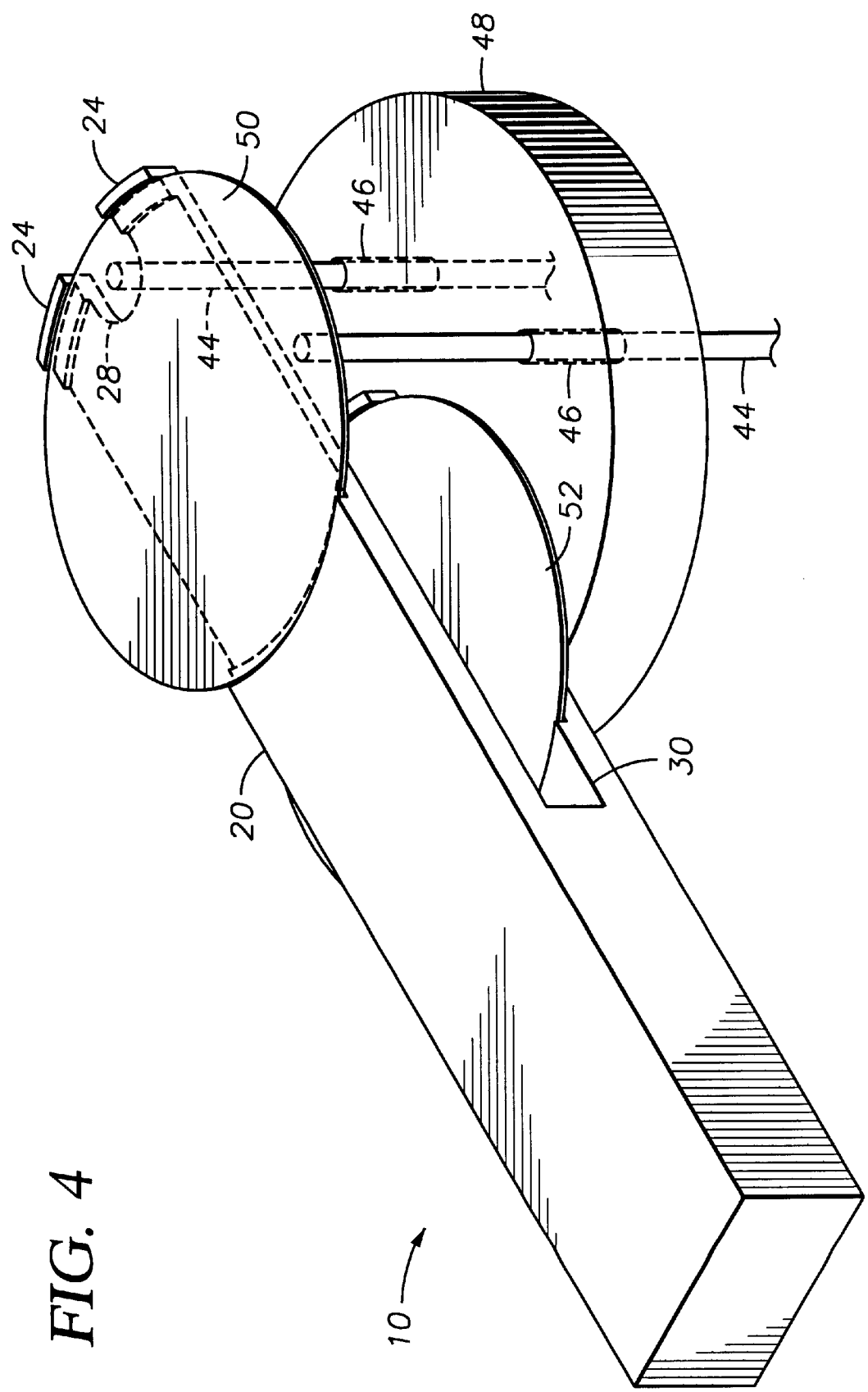
FIG. 4 is a substantially top perspective view of one embodiment of the present invention showing the robot blade transferring two substrates.

FIG. 4 is a substantially top perspective view of one embodiment of the present invention showing the robot blade 10 transferring two substrates. The lower substrate supporting surface 32 is preferably offset horizontally from the upper substrate supporting surface 22 so that the lifting pins 44 disposed in a typical substrate processing pedestal can lift off or place a substrate on the upper substrate supporting surface 22 without touching a substrate that is situated on the lower substrate supporting surface 32. The horizontal offset distance D2 is preferably minimized to reduce the length of the robot stroke, and thus, the time required to position the blade 10 for transfer of substrates to and/or from each of the platforms 20, 30. As shown in FIG. 4, the horizontal offset distance D2 is preferably minimized by situating the lower substrate supporting surface 32 so that the circumferential edge of a substrate 42 disposed on the lower platform nearly touches the extended lift pins 44 when the upper platform is aligned in a position for transferring a substrate on the upper platform 20. The configuration of the lift pins 44 can be arranged to minimize the horizontal offset required. For example, an equilateral triangle lift pin configuration (i.e., each pin located at the corners of an imaginary equilateral triangle) requires a shorter horizontal offset than a square lift pin configuration (i.e., each pin located at the corners of an imaginary square). An isosceles triangle lift pin configuration can reduce the horizontal offset even more, as long as the lift pin configuration still provides the essential functions of lifting and placing the substrates onto the substrate supporting surfaces.

A substrate pedestal 48 typically includes three or more vertical bores 46 corresponding to the lift pin configuration. Each of the vertical bores contains a vertically slideable lift pin 44. When the lift pins 44 are in the retracted position, the upper tip of each lift pin 44 occupies the same plane as the upper surface of the substrate pedestal 48. The lift pins 44 can be extended or retracted to desired positions within the chamber by a drive mechanism (not shown) connected to the lift pins 44 such as a stepper motor coupled to a lead screw. By rotating the lead screw, a nut thereon attached to the pins may be removed inwardly or outwardly of the chamber direction, thereby moving the pins. Small arcuate steps of motor movement thereby translate into small increments of pin movement. The substrate pedestal 48 is preferably connected to a drive mechanism (not shown) as well to facilitate vertical movements.

The robot blade 10 is functionally versatile in transferring substrates because it can remove the processed substrate from a processing chamber with either the upper platform 20 or the lower platform 30, whichever is unoccupied by a substrate at the time. However, the lift pins 44 in the processing chamber must be programmed to coordinate with the transferring operation so that the lift pins 44 place the processed substrate at the correct position corresponding to the unoccupied platform for removal. The robot blade 10 is adapted to alternate between the upper platform 20 and lower platform 30 for transferring substrates according to the desired substrate delivery scheme employed in a particular system. The lift pins 44 are preferably controlled by a microprocessor so that the lift pins can extend to a first position that is higher than the upper platform for transferring substrates to and from the upper platform and a second position that corresponds to the gap between the upper and the lower platform for transferring substrates to and from the lower platform. Also, caution must be exercised in transferring substrates in and out of the lower platform 30 because the narrow margin available for movement of the substrate within the space D1 between the upper and lower platforms. It is important to position the lift pins 44 appropriately because the substrate may collide with either the upper or lower platforms if the substrate is not positioned by the lift pins correctly for transfer.

FIGS. 5a–5d are side views of the present invention showing the positions of the robot blade, the substrates and the lift pins during substrate transfers. The following describes a preferred method of utilizing the robot blade 10 of the present invention for transferring substrates in a single processing chamber system having one processing chamber and a substrate cassette or other storage structure in a loadlock chamber. The robot first moves an unprocessed substrate from a substrate cassette in a loadlock chamber into the processing chamber to be processed. The substrate cassette typically holds a number of substrates in a vertical stack with sufficient space in between each substrate to facilitate removal and replacement of each substrate. The substrate cassette is indexed upwardly and/or downwardly to appropriately align the substrate cassette for transferring substrates onto the robot blade. Preferably the unprocessed substrates are removed sequentially from the bottom of the cassette, and the processed substrates are returned sequentially to the cassette from the top of the cassette. To remove a first unprocessed substrate, the robot blade 10 moves into a position so that the upper substrate supporting surface 22 is positioned under the first unprocessed substrate in the substrate cassette in the loadlock chamber. The unprocessed substrate 50 is lowered onto the upper substrate supporting surface 22 by indexing the wafer cassette downwardly. The substrate is held in place by clamping ridges 24 and 26. Alternatively, the robot blade can move upwardly to lift the wafer from its position in the cassette. The robot retracts the blade 10 out of the loadlock chamber and then rotates (i.e., passes the blade in an arcuate path about shaft 8) so that the blade 10 is positioned to enter the slit valve of a processing chamber. The slit valve opens and the robot extends the blade 10 into the processing chamber such that the upper substrate supporting surface 22 and the first unprocessed substrate is directly over the substrate pedestal 48 and lift pins 44 disposed in the substrate pedestal. The lift pins 44 extend upwardly and lift the first unprocessed substrate off the upper substrate support surface 22, and the blade 10 retracts out of the processing chamber. The slit valve closes as the lift pins 44 retract to lower the first unprocessed substrate onto the substrate pedestal 48 in the processing chamber, ready for processing.

While the substrate is being processed, the robot rotates to align the robot blade 10 for pick-up of the next unprocessed substrate from the substrate cassette in the loadlock chamber. The robot inserts the robot blade 10 into the loadlock chamber to position the upper substrate supporting surface 22 under another unprocessed substrate 50 on the substrate cassette. The unprocessed substrate 50 is lowered onto the upper substrate supporting surface 22 and held in place by clamping ridges 24 and 26. The robot retracts the blade 10 out of the loadlock chamber and rotates so that the blade 10 is positioned to enter the slit valve of the processing chamber.

Figures 5A, 5B, 5C, 5D:
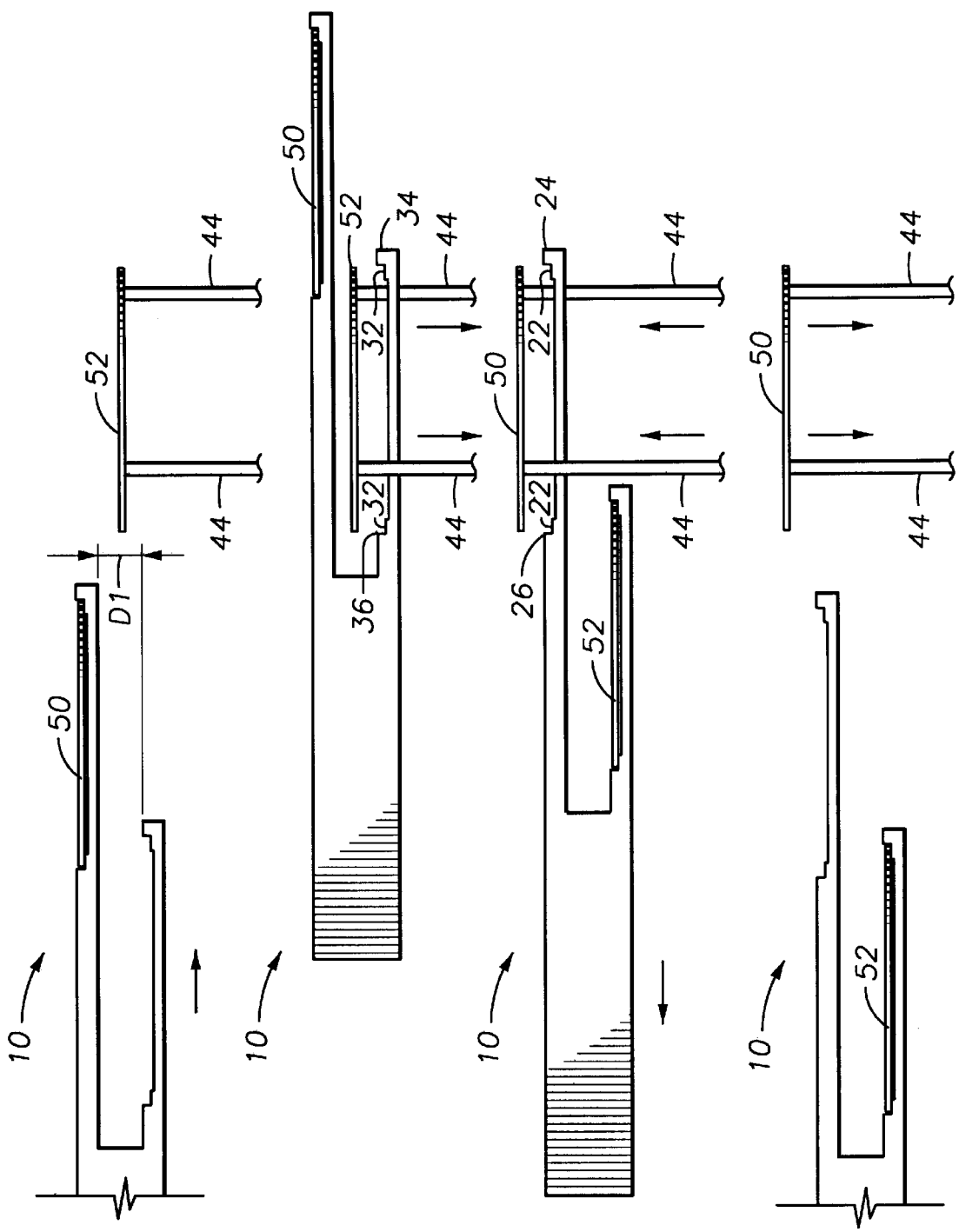
FIGS. 5a–5d are side views of the present invention showing the positions of the robot blade, the substrates and the lift pins during substrate transfers.

Immediately after processing the first substrate, lift pins 44 on the substrate pedestal 48 in the processing chamber lift the processed substrate 52 to a first height position corresponding to the gap defined by the distance D1 between the upper platform 20 and the lower platform 30, as shown in FIG. 5a. Alternatively, the pedestal may move downwardly with the pins held stationary, to position the substrate off the pedestal. Referring to FIG. 5a, immediately after the processed substrate 52 is moved into the appropriate height position by the lift pins 44 in the processing chamber, the slit valve opens and the robot extends the blade 10 into the processing chamber such that the lower substrate supporting surface 32 is positioned directly under the processed substrate 52, ready to remove the processed substrate 52. Referring to FIG. 5b, the lift pins 44 retract so that the processed substrate 52 is placed onto the lower substrate supporting surface 32 and held in place by clamping ridges 34 and 36. The robot then retracts a distance equivalent to the horizontal offset distance D2 to position the upper substrate supporting surface 22 and the unprocessed substrate 50 directly over the substrate pedestal 48 and lift pins 44. As shown in FIG. 5c, the lift pins 44 extend upwardly and lift the unprocessed substrate 50 off the upper substrate supporting surface 22 and the blade 10. Referring to FIG. 5d, the blade 10 then retracts out of the processing chamber, and the slit valve closes as the lift pins 44 retract fully and the unprocessed substrate 50 is placed on the substrate pedestal 48 in the processing chamber, ready for processing.

The robot then rotates and returns the processed substrate 52 into a substrate cassette, from the top of the cassette. The robot retracts so that the substrate cassette can move up to position the next unprocessed substrate for pick-up or rotate to pick up a substrate in another cassette/loadlock chamber or other chambers. Then the robot extends the robot blade under the next unprocessed substrate and repeats the steps for transferring substrates.

The present invention removes processed substrates out and transfers unprocessed substrates into a chamber while greatly reducing idle time of the processing chamber by accomplishing substrate transfers by as little as one extension and two retractions of the robot arm. The above described method can be applied alternatively between the upper and lower platforms by changing the positioning of the lift pins appropriately. The present invention also provides a great advantage in reduction of the probability of introducing contamination into the processing chamber by minimizing slit valve size and the required time the slit valve needed to be kept open because the slit valve need only allow passage of a single robot blade and only one entry per exchange of processed and unprocessed substrates.

The robot blade described above can be used to perform a substrate shuttle operation while reducing dead time and increasing throughput. To achieve this advantage, the robot assembly rotates to position the robot blade in alignment with a selected chamber with an unprocessed substrate placed on either the lower or upper substrate supporting surface. The robot blade is then inserted into the selected chamber and a substrate which has been processed in the chamber is retrieved on the unoccupied substrate supporting surface for removal from the chamber. The unprocessed substrate is placed in the chamber in the same insertion of the blade for removal of the processed substrate from the chamber. The single insertion shuttle transfer of substrates is accomplished simply by either retraction of the blade by the horizontal offset distance D2 if the unprocessed substrate is on the upper platform 20 or the extension of the blade by the horizontal offset distance D2 if the unprocessed substrate is on the lower platform 30. Once the substrate shuttle operation has been performed, the processed substrate can be moved to another location within the process system and another substrate can be retrieved for transport through the system.

Modern semiconductor processing systems generally include cluster tools that integrate a number of process chambers together in order to perform several sequential processing steps without removing the substrate from the highly controlled processing environment. These chambers may include, for example, degas chambers, substrate preconditioning chambers, cool-down chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through the same series of chambers or process steps. The process recipes and sequences will typically be programmed into a microprocessor controller that will direct, control and monitor the processing of each substrate through the cluster tool. Once an entire cassette of substrates have been successfully processed through the cluster tool, the cassette may be passed to yet another cluster tool or stand alone tool, such as a chemical mechanical polisher, for further processing.

Figure 6:
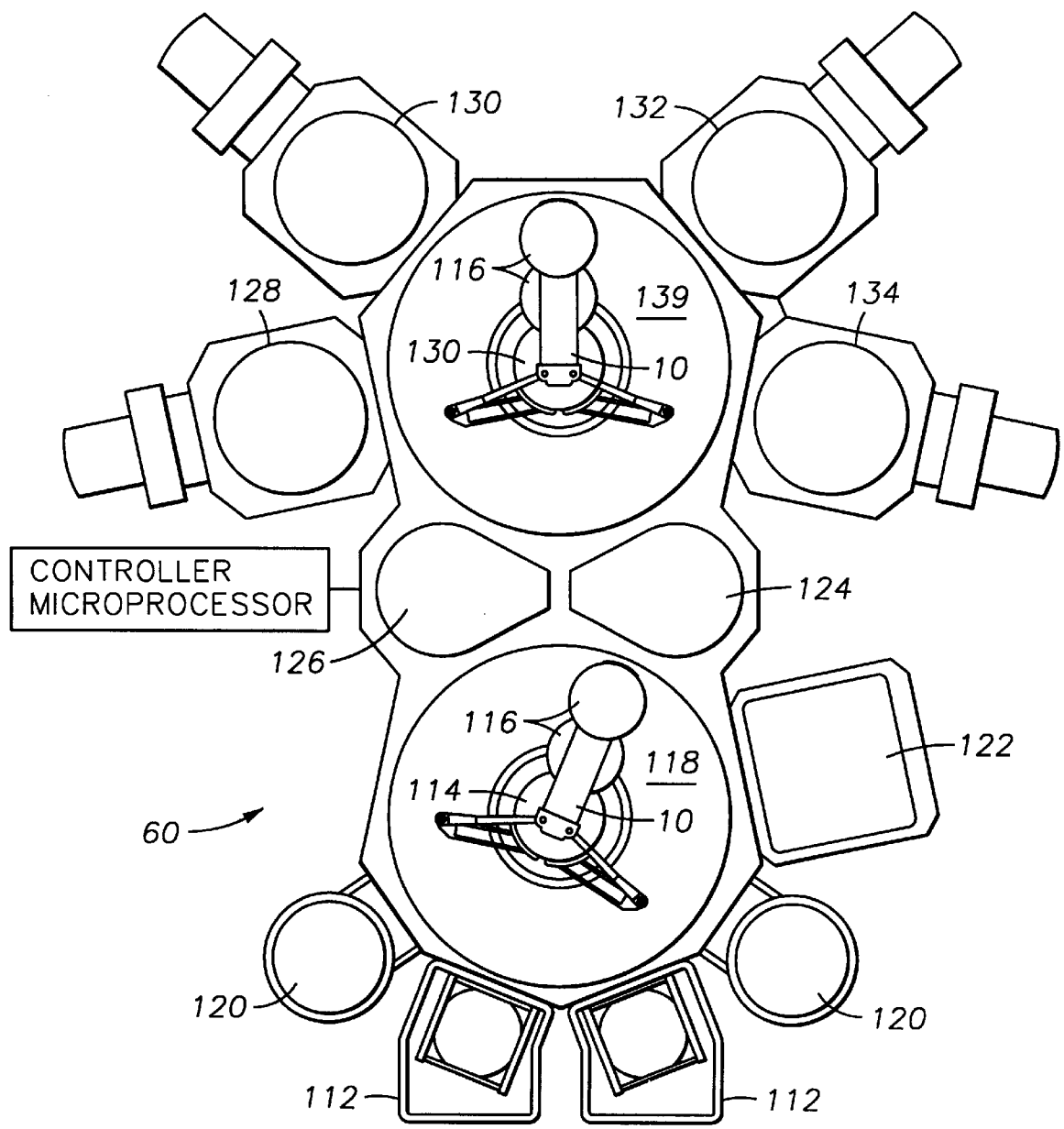
FIG. 6 is a schematic top view of a multi chamber processing system including a robot having a robot blade of the present invention.

FIG. 6 is a schematic diagram of an exemplary integrated cluster tool 60. A robot 114 can be incorporated into a first transfer chamber 118 of a cluster tool to allow more rapid transfer of substrates 116 from one location to another. Substrates 116 are introduced into and withdrawn from the cluster tool 60 through a cassette loadlock 112. A robot 114 having an robot blade 10 of the present invention is located within the cluster tool 60 to transfer the substrates from one process chamber to another, for example, a cassette loadlock 112, a degas wafer orientation chamber 120, a pre-clean chamber 124, a PVD TiN chamber 122 and a cool-down chamber 126. The robot blade 10 is illustrated in the retracted position for rotating freely within the chamber 118.

A second robot 130 is located in a second transfer chamber 139 to transfer substrates between various chambers, such as the cool-down chamber 126, PVD Ti chamber 128, PVD TiN chamber 130, CVD Al chamber 132, and PVD AlCu processing chamber 134. The specific configuration of the chambers in FIG. 6 is merely illustrative and comprises an integrated processing system capable of both CVD and PVD processes in a single cluster tool. In a preferred aspect of the invention, a microprocessor controller is provided to control the fabricating process sequence, conditions within the cluster tool and operation of the robots such that the robot blade alternates between the upper platform and the lower platform when transferring substrates and that the lift pins within each processing chamber are positioned accordingly to correspond to the substrate transfers.

The present invention can be used with single robots, dual robots, dual independent robots, dual blade robots, and various other robot configurations where robot blades are generally employed. Additionally, all movements described herein are relative to positions of objects such as the robot blade, the lift pins and the pedestal. Accordingly, it is contemplated by the present invention to move any or all of the components to achieve the desired movement of substrates through a processing system.

While the foregoing is directed to the preferred embodiment of the present invention, other and further embodiments of the invention may be devised without departing from the basic scope thereof. The scope of the invention is determined by the claims which follow.

I claim:

1. An apparatus for transferring objects, comprising:
   a robot having at least one actuator to drive at least one arm and a blade mounted to the arm, the blade comprising an upper platform having an upper object supporting surface and a lower platform having a lower object supporting surface, the upper object supporting surface being horizontally offset from the lower object supporting surface and fixed relative to the lower object supporting surface.

2. The apparatus of claim 1, wherein the upper object supporting surface occupies a plane substantially parallel with the lower object supporting surface.

3. The apparatus of claim 1, wherein the upper object supporting surface is horizontally offset from the lower object supporting surface at a distance between the radius and the diameter of the upper object supporting surface.

4. The apparatus of claim 1, further comprising means for retracting the at least one arm.

5. The apparatus of claim 1, further comprising means for rotating the at least one arm.

6. The apparatus of claim 1, further comprising clamping ridges partially outlining a circumference of the upper object supporting surface and a circumference of the lower object supporting surface.

7. The apparatus of claim 6, wherein the clamping ridges extend about a height of a substrate thickness.

8. The apparatus of claim 1, wherein the upper platform includes a recess at an edge of the upper platform.

9. The apparatus of claim 1, wherein the upper platform is vertically spaced from the lower platform at a distance greater than a substrate thickness.

10. A method for transferring objects comprising:
   a) providing a blade having at least an upper object supporting surface horizontally offset from a lower object supporting surface and fixed relative to the lower object supporting surface;
   b) positioning the upper object supporting surface to receive a first object; and
   c) positioning the lower object supporting surface to deliver a second object.

11. The method of claim 10, wherein the upper object supporting surface is vertically offset from the lower object supporting surface at a distance greater than a substrate thickness.

12. The method of claim 10, wherein the step of positioning the upper object supporting surface comprises:
   i) moving the upper object supporting surface under a first object; and
   ii) positioning the first object onto the upper object supporting surface; and wherein the step of positioning the lower object supporting surface comprises:
   i) moving the lower object supporting surface having a second object thereon; and ii) removing the second object from the lower object supporting surface.

13. The method of claim 12, further comprising:
d) moving the upper object supporting surface having the first object thereon; and
e) removing the first object from the upper object supporting surface.

14. The method of claim 10, wherein the step of positioning the upper object supporting surface comprises:
i) moving the upper object supporting surface under a first object within a first chamber; and
ii) positioning the first object onto the upper object supporting surface; and wherein the step of positioning the lower object supporting surface comprises:
i) moving the lower object supporting surface having a second object thereon into the first chamber; and
ii) removing the second object from the lower object supporting surface; and further comprising:
d) moving the upper object supporting surface having the first object thereon into a second chamber; and
e) removing the first object from the upper object supporting surface.

15. A multi-chamber process system, comprising:
a) a transfer chamber;
b) a plurality of process chambers connected to the transfer chamber;
c) a robot disposed within the transfer chamber; and
d) a robot blade attached to the robot, comprising:
i) an upper platform having an upper object supporting surface; and
ii) a lower platform having a lower object supporting surface; wherein the upper platform is vertically and horizontally spaced from the lower platform and fixed relative to the lower platform.

16. The apparatus of claim 15, wherein the upper object supporting surface is horizontally offset from the lower object supporting surface at a distance between the radius and the diameter of the upper object supporting surface.

17. The apparatus of claim 15, wherein the robot comprises means for retracting and rotating the robot blade.

18. The apparatus of claim 15, further comprising clamping ridges partially outlining the circumferences of the upper and lower object supporting surfaces.

19. The apparatus of claim 15, wherein the upper platform includes a recess at an edge of the upper platform.

20. The apparatus of claim 15, wherein the upper platform is vertically spaced from the lower platform at a distance greater than a substrate thickness.

21. A method of transferring substrates within a multiple chamber system having at least a first process chamber and a second process chamber, comprising:
a) providing a transfer chamber connected to the first and second process chambers;
b) providing a robot within the transfer chamber;
c) providing a blade attached to the robot, the blade comprising:
i) an upper platform having an upper substrate supporting surface; and
ii) a lower platform having a lower substrate supporting surface, wherein the upper platform is horizontally offset from the lower platform and fixed relative to the lower platform;
d) positioning the blade within the first chamber;
e) retracting the blade out of the first chamber;
f) positioning the blade within the second chamber; and
g) retracting the blade out of the second chamber.

22. The method of claim 21, wherein the step of positioning the blade within the first chamber comprises:
i) moving the upper substrate supporting surface under a first substrate within the first chamber; and
ii) positioning the first substrate onto the upper substrate supporting surface.

23. The method of claim 22, wherein the step of positioning the blade within the second chamber comprises:
i) moving the lower substrate supporting surface under a second substrate within the second chamber;
ii) positioning the second substrate onto the lower substrate supporting surface;
iii) moving the upper substrate supporting surface a fixed distance within the second chamber; and
iv) removing the first substrate from the upper substrate supporting surface.

24. An apparatus comprising a blade with two supports, wherein the first support forms an upper platform having an upper substrate supporting surface and the second support forms a lower platform having a lower substrate supporting surface, wherein both the first and second supports are rigidly fixed to the blade which is connected to a wrist housing of a robot arm assembly and wherein the first support is horizontally offset from the second support.

* * * * *